(12) United States Patent
Kim (10) Patent No.: US 7,300,842 B2
(45) Date of Patent: Nov. 27, 2007

(54) METHOD OF FABRICATING A MASK ROM

(75) Inventor: Heung Jin Kim, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 4 days.

(21) Appl. No.: 11/319,497

(22) Filed: Dec. 29, 2005

(65) Prior Publication Data

US 2006/0145272 A1    Jul. 6, 2006

(30) Foreign Application Priority Data

Dec. 30, 2004    (KR) .................. 10-2004-0116148

(51) Int. Cl.
*H01L 21/336*    (2006.01)
(52) U.S. Cl. .................. 438/257; 438/262; 438/264; 438/265; 438/278
(58) Field of Classification Search .................. None
See application file for complete search history.

(56) References Cited

U.S. PATENT DOCUMENTS

| | | | |
|---|---|---|---|
| 5,200,355 A * | 4/1993 | Choi et al. .................. | 438/278 |
| 5,681,770 A * | 10/1997 | Ogura et al. .................. | 438/257 |
| 5,753,525 A * | 5/1998 | Hsu et al. .................. | 438/261 |
| 5,792,697 A * | 8/1998 | Wen .................. | 438/275 |
| 6,008,093 A * | 12/1999 | Aoki et al. .................. | 438/276 |
| 6,274,453 B1 * | 8/2001 | Schlosser et al. .................. | 438/386 |
| 6,706,575 B2 * | 3/2004 | Fan et al. .................. | 438/197 |
| 6,815,781 B2 * | 11/2004 | Vyvoda et al. .................. | 257/377 |
| 6,821,841 B1 * | 11/2004 | Wu et al. .................. | 438/243 |
| 6,897,514 B2 * | 5/2005 | Kouznetsov et al. .................. | 257/314 |
| 7,105,409 B2 * | 9/2006 | Kobayashi et al. .................. | 438/266 |

FOREIGN PATENT DOCUMENTS

KR    10-2004-0040526    5/2004

* cited by examiner

*Primary Examiner*—Mary Wilczewski
*Assistant Examiner*—Khanh Duong
(74) *Attorney, Agent, or Firm*—McKenna Long & Aldridge LLP (57) ABSTRACT

A mask ROM and fabrication method thereof are disclosed, in which a bit line is formed of a conductive material such as polysilicon, by which a device size can be minimized, and by which resistance characteristics are enhanced.

4 Claims, 7 Drawing Sheets

METHOD OF FABRICATING A MASK ROM

CROSS REFERENCE TO RELATED APPLICATION

This application claims the benefit of the Korean Patent Application No. P2004-0116148, filed on Dec. 30, 2004, which is hereby incorporated by reference for all purposes as if fully set forth herein.

BACKGROUND OF THE INVENTION

1. Field of the Invention

The present invention relates to a semiconductor device, and more particularly, to a mask ROM and fabrication method thereof. Although the present invention is suitable for a wide scope of applications, it is particularly suitable for forming a bit line of a conductive material such as polysilicon to minimize device size and to enhance resistance characteristics.

2. Discussion of the Related Art

Typically, a flat ROM device is named after its structure. The name of the device is attributed to a fact that a step difference of a shape of bit and word lines is smaller than that of another memory device. A mask ROM is the name for specific coding selectively performed to set a specific cell to 0 or 1 through a mask process. Yet, it does not matter that the flat form is used together with the mask ROM.

A mask ROM and fabrication method thereof are explained with reference to the attached drawings as follows.

Figure 1A:
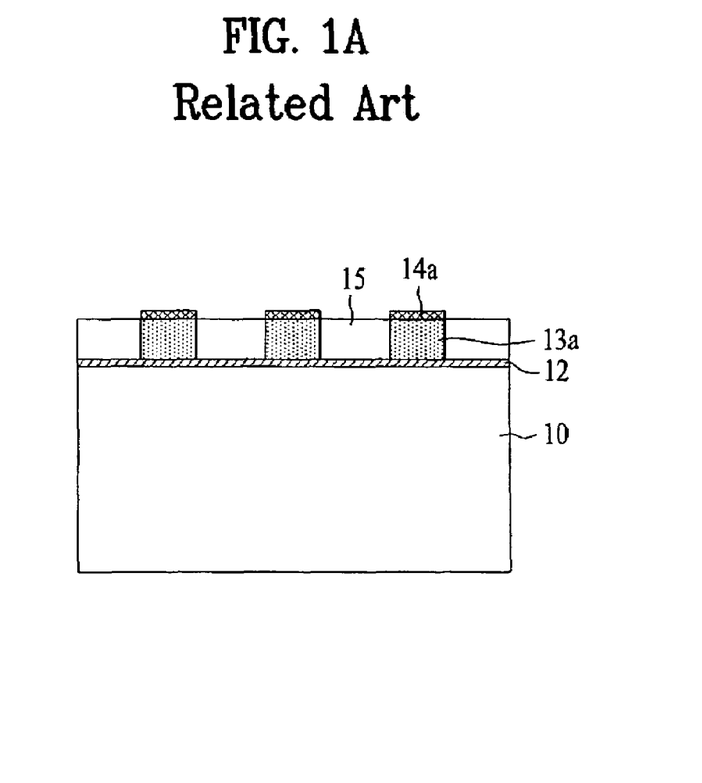
FIG. 1A is a cross-sectional diagram of a mask ROM in a bit line direction according to a related art.
Figure 1B:
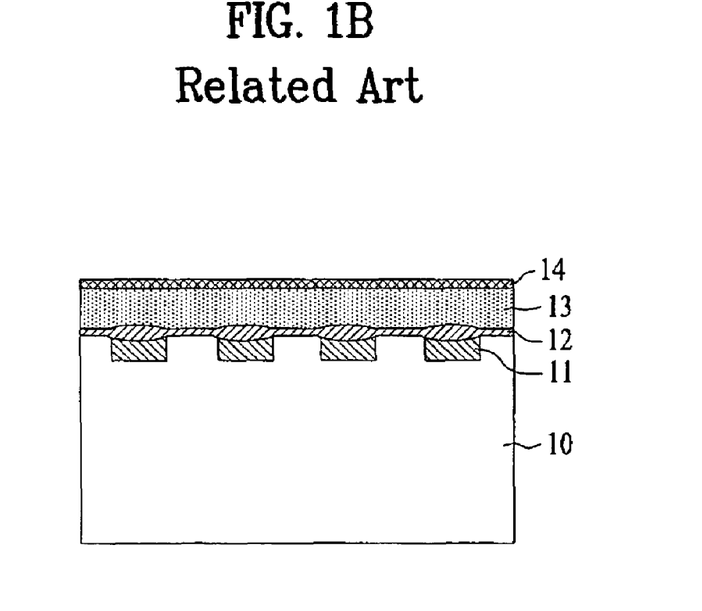
FIG. 1B is a cross-sectional diagram of a mask ROM in a word line direction according to a related art.

FIG. 1A is a cross-sectional diagram of a bit line of a mask ROM according to a related art, and FIG. 1B is a cross-sectional diagram of a word line of a mask ROM according to a related art.

Referring to FIG. 1A, in observing a mask ROM according to a related art in a bit line direction, a plurality of word lines are patterned over a substrate 10 having a gate oxide layer 12 formed thereon to leave a prescribed width from one another. Each of the word lines consists of a stack of polysilicon 13a and silicide 14a.

Referring to FIG. 1B, in observing a mask ROM according to a related art in a word line direction, a gate oxide layer 12 is formed on a substrate 10 having a BN (buried N-doped) junction region 11 defined on a prescribed area. A polysilicon layer 13 and silicide 14 are sequentially stacked on the gate oxide layer 12. The gate oxide layer 12 over the BN junction region 11 is formed relatively thicker than the other portion. The BN junction region 11 buried in the substrate 10 plays the role of a bit line.

The above-explained mask ROM of the related art is fabricated in a following manner.

First, a device isolation area (not shown in the drawing) is formed on a semiconductor substrate 10 by LOCOS (local oxidation of silicon) or STI (shallow trench isolation). An area of the semiconductor substrate 10 excluding the device isolation area is defined as an active area.

Subsequently, a well is formed in the active area. A nitride layer (not shown in the drawing) is deposited on the semiconductor substrate 10. A photoresist pattern is formed on the nitride layer. The nitride layer is patterned to correspond to a width of the photoresist pattern. Ion implantation is then carried out on a prescribed portion of the semiconductor substrate 10 to define an impurity region using the patterned nitride layer as a mask. The defined impurity region corresponds to a BN (buried N doped) junction region 11.

After the patterned nitride layer has been removed, the semiconductor substrate 10 is cleaned. A gate oxide layer 12 is formed on the semiconductor substrate 10. In doing so, a portion of the gate oxide layer 12 formed on the BN junction region 11 is formed thicker than the other portion of the gate oxide layer 12.

A polysilicon layer 13 is formed on the gate oxide layer 12. A silicide 14 is formed by performing silicidation on the polysilicon layer 13. The silicide 14 and the polysilicon layer 13 are then selectively removed to form a silicide layer 14a and a gate electrode layer 13a, respectively. The silicide layer 14a is formed on the gate electrode layer 13a to form a stack. The stack consisting of the silicide stack 14a and the gate electrode layer 13a functions as a word line.

Subsequently, a gap between a pair of the stacks is filed up with an insulating layer 15.

Ion implantation is performed to form an LDD region and a heavily doped junction region.

In fabricating the flat cell type mask ROM according to the related art, the BN junction region 11 used as a bit line is formed by implanting ions into a pure active area and by annealing the ion-implanted region.

A region between a pair of the BN junction regions 11 functioning as bit lines, respectively corresponds to a channel of a cell transistor. A pair of the BN junction regions 11 are operative as source and drain, respectively.

The BN junction region 11 is formed relatively long in the flat cell type mask ROM. Inter-line resistance of the BN junction region 11 has considerable bad influence on driving a cell. To maintain the appropriate resistance, a junction depth and a line width need to be appropriately adjusted. Yet, as a cell size is reduced, it is difficult to appropriately implement the junction depth and line width in aspect of channel margin.

SUMMARY OF THE INVENTION

Accordingly, the present invention is directed to a mask ROM and fabrication method thereof that substantially obviates one or more problems due to limitations and disadvantages of the related art.

An advantage of the present invention is that it provides a mask ROM and fabricating method thereof, in which a bit line is formed of a conductive material such as polysilicon, by which a device size can be minimized, and by which resistance characteristics are enhanced.

Additional advantages and features of the invention will be set forth in part in the description which follows, and will become apparent from the description, or may be learned by practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a mask ROM present invention includes a semiconductor substrate divided into a device isolation area and an active area, an impurity region on a prescribed portion in the active area, a first electrode layer pattern on the semiconductor substrate to correspond to a region except the impurity region, a second electrode layer pattern on the impurity region, and a third electrode layer pattern over the semiconductor substrate including the first and second electrode patterns.

In another aspect of the present invention, a method of fabricating a mask ROM includes the steps of forming a gate insulating layer on a semiconductor substrate divided into a device isolation area and an active area, depositing a first electrode layer, a first dielectric layer and a second dielectric layer on the gate insulating layer, forming a first electrode layer pattern, a first dielectric layer pattern and a second dielectric layer pattern, each having a same width, on a predetermined area of the gate insulating by selectively removing the first electrode layer, the first dielectric layer and the second dielectric layer, forming the impurity region by implanting impurities into an area except the first electrode layer pattern, forming a second electrode layer pattern on the impurity region, forming an oxide layer by oxidizing a surface of the second electrode layer pattern, removing the first and second dielectric layer patterns, forming a third electrode layer over the semiconductor substrate including the first and second electrode layer patterns, planarizing the third electrode layer, forming a word line by selectively removing the first and third electrode layers, and filling a gap between the word lines with an oxide layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, the same reference numbers will be used throughout the drawings to refer to the same or like parts.

Figure 2A:
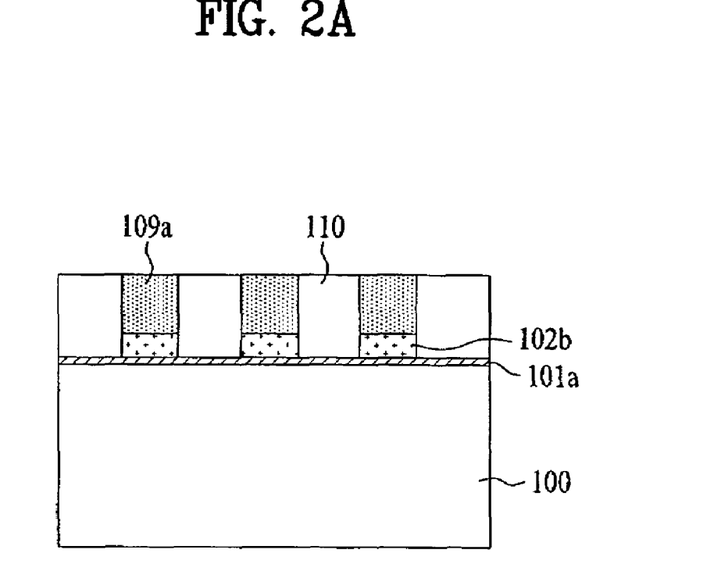
FIG. 2A is a cross-sectional diagram of a mask ROM in a bit line direction according to an exemplary embodiment of the present invention.
Figure 2B:
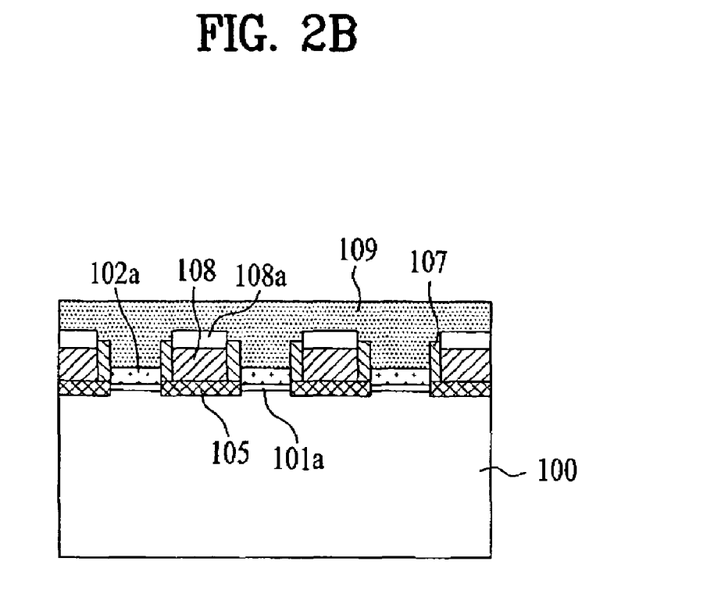
FIG. 2B is a cross-sectional diagram of a mask ROM in a word line direction according to an exemplary embodiment of the present invention.

FIG. 2A is a cross-sectional diagram of a mask ROM according to an exemplary embodiment of the present invention in a bit line direction and FIG. 2B is a cross-sectional diagram of a mask ROM according to an exemplary embodiment of the present invention in a word line direction.

Referring to FIG. 2A and FIG. 2B, a mask ROM according to an exemplary embodiment of the present invention includes a semiconductor substrate 100 having a device isolation layer (not shown in the drawings) and an active area defined thereon, a BN (buried N doped) impurity region 105 formed on a prescribed region of the active area, a second electrode layer pattern 108 formed on the impurity region 105 to have a prescribed height, a spacer 107 on the second electrode layer pattern, a first electrode layer pattern 102a formed on a region except the impurity region 105 to have a height shorter than that of the second electrode layer pattern 108, a spacer 107 provided to a lateral side of the first electrode layer pattern 102a to isolate the first electrode layer pattern 102a from the second electrode layer pattern 108, and a third electrode layer pattern 109a formed over the semiconductor substrate 100 including the first and second electrode layer patterns 102a and 108 and the spacer 107.

A gate insulating layer 101a is formed between the semiconductor substrate 100 and the first electrode layer pattern 102b.

The first electrode layer pattern 102b and the third electrode layer pattern 109a, as shown in FIG. 2A, are as wide as the first electrode layer pattern 102a are defined as a word line. The first electrode layer pattern 102b contacts with the third electrode layer pattern 109a. Moreover, a gap between a pair of the word lines is filed up with an insulating layer 110.

The BN junction region 105 and the second electrode layer pattern 108a contacting with the BN junction region 105, as shown in FIG. 2B, functions as a bit line. An oxide layer 108b is further formed on the second electrode layer pattern 108a to isolate the second electrode layer pattern 108a from the third electrode layer pattern 109.

The first to third electrode layers 102a, 108a and 109 may be formed of doped silicon or polysilicon.

A method of fabricating a mask ROM according to an exemplary embodiment of the present invention is explained with reference to FIGS. 3A to 3J, in which cross-sectional views in bit and word line directions are shown.

Figure 3A:
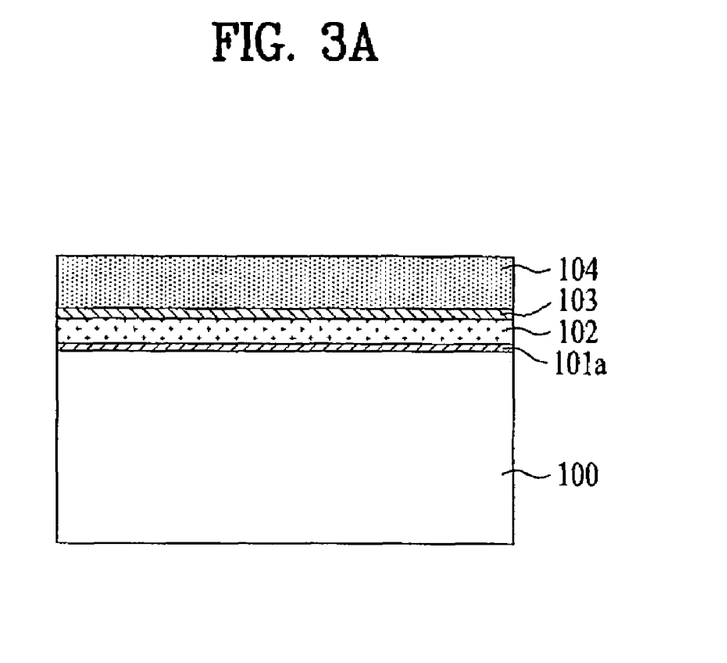
FIGS. 3A to 3J are cross-sectional diagrams for explaining a method of fabricating a mask ROM according to an exemplary embodiment of the present invention in a bit line direction.
Figure 3B:
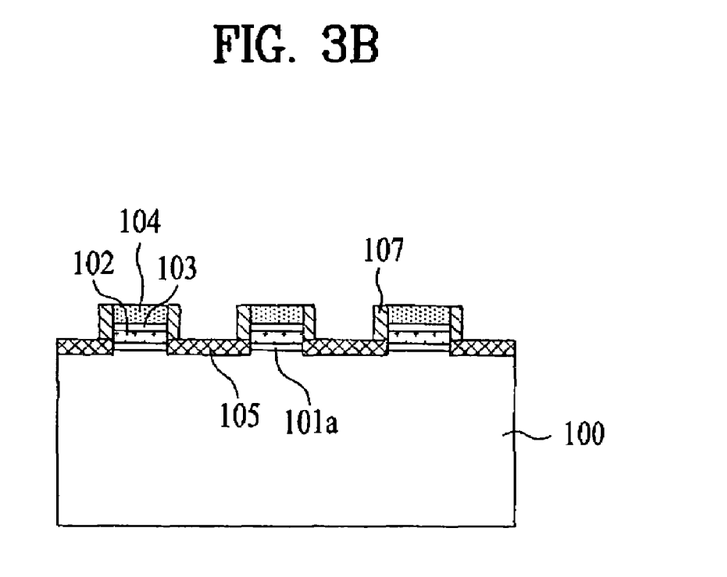

Referring to FIG. 3A and FIG. 3B, a device isolation area (not shown in the drawings) is formed on a semiconductor substrate 100 to define a device isolation area and an active area. An area except the device isolation area is defined as the active area.

A gate insulating layer 101a is formed on the substrate 100.

A first electrode material of polysilicon is deposited on the semiconductor substrate 100 and is then doped. A first dielectric layer and a second dielectric layer are sequentially deposited on the first electrode material. The second dielectric layer 104, the first dielectric layer and the first electrode material are etched to have the same width using a prescribed mask to form a first electrode layer pattern 102, a first dielectric layer pattern 103 and a second dielectric layer pattern 104. A third dielectric layer is deposited over the semiconductor substrate 100 including the second dielectric layer pattern 104. The third dielectric layer is etched back to form a sidewall spacer on lateral sides of the first electrode layer pattern 102, the first dielectric layer pattern 103 and the second dielectric layer pattern 104.

Impurities are implanted into the semiconductor substrate 100 using the first electrode layer pattern 102, the first dielectric layer pattern 103 and the second dielectric layer pattern 104 having the same width each as a mask to form a BN junction region 105. Optionally, a buffer insulating layer may be deposited on the semiconductor substrate before the formation of the impurity region. In doing so, the BN junction region 105 is formed shallow. The BN junction region 105 is not singly defined as a bit line but functions as the bit line together with a second electrode layer pattern 108 that will be formed later. Hence, the BN junction region 105 is formed to have a small size and depth.

Figure 3C:
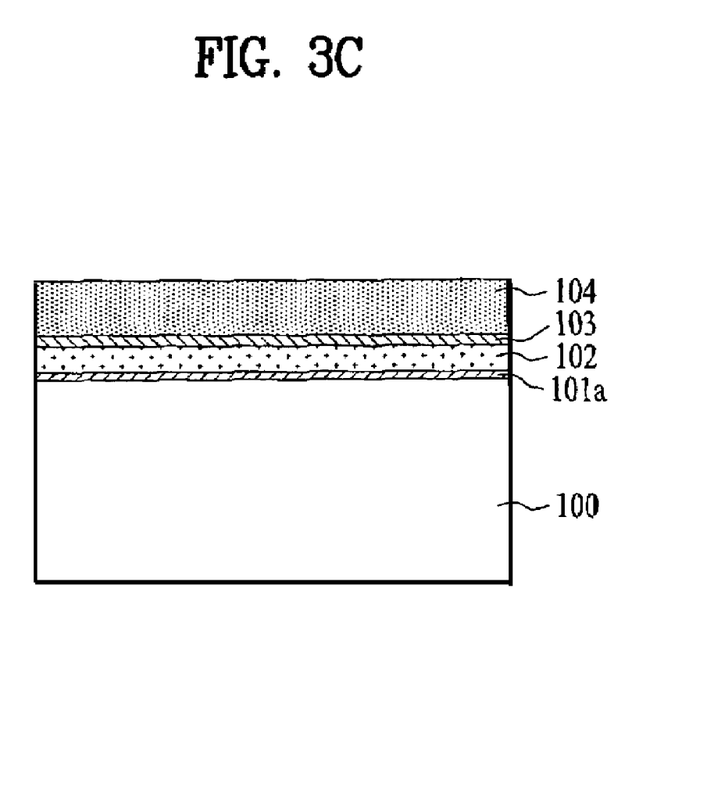
Figure 3D:
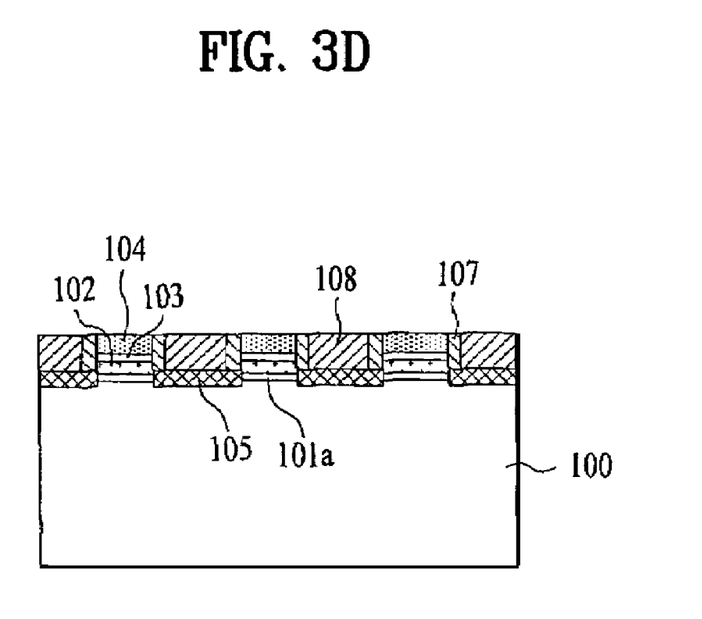

Referring to FIG. 3C and FIG. 3D, polysilicon is deposited over the semiconductor substrate including the sidewall spacer 107 and is then etched back to form a second electrode layer pattern 108.

The BN junction region 105 contacts the second electrode layer pattern 108 to configure a stack functioning as a bit line.

Figure 3E:
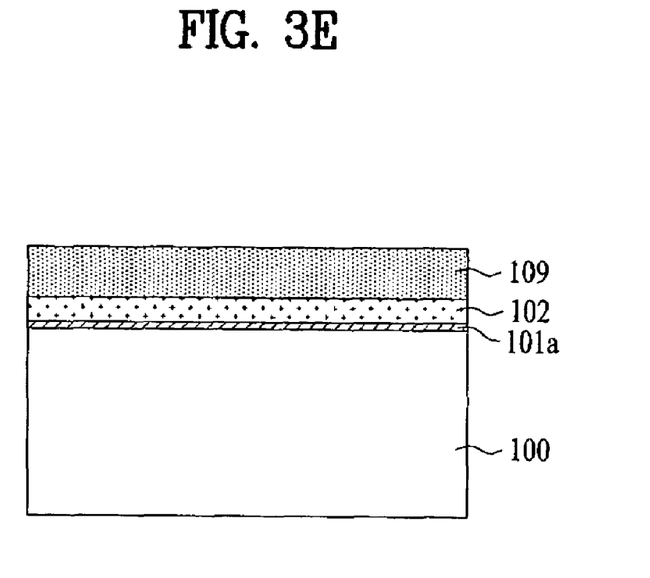
Figure 3F:
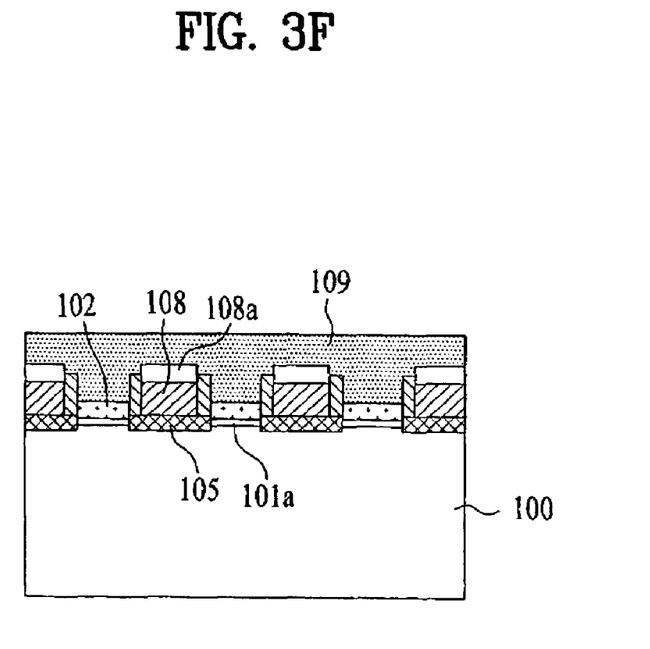

Referring to FIG. 3E and FIG. 3F, an oxide layer pattern 108a is formed by oxidizing a surface of the second electrode layer pattern 108. And, the second and first dielectric layer patterns 104 and 103 are removed.

Subsequently, a polysilicon layer is deposited over the semiconductor substrate 100 including the first electrode layer pattern 102 and the oxide layer pattern 108a on the second electrode layer pattern 108 to form a third electrode layer 109.

Figure 3G:
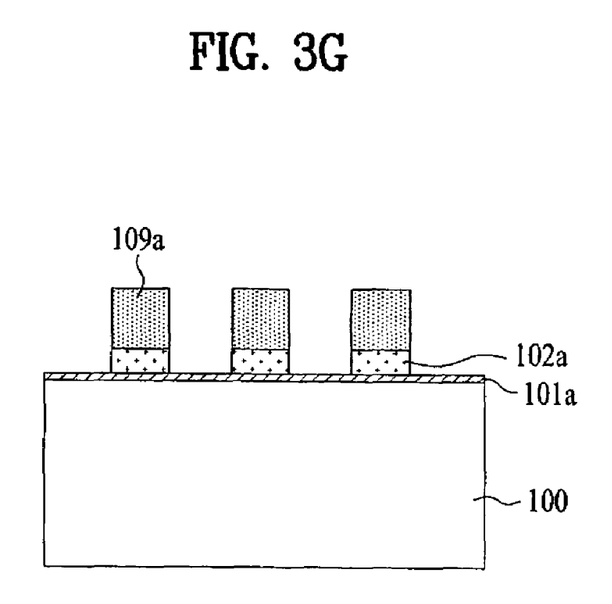
Figure 3H:
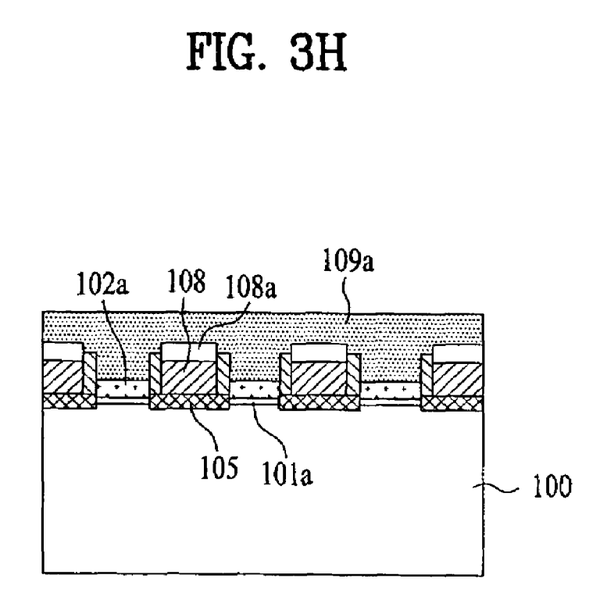

Referring to FIG. 3G and FIG. 3H, the third electrode layer 109 and the first electrode layer pattern 102 are selectively removed to form a third electrode layer pattern 109a and a first electrode layer 102a configuring a stack functioning as a word line.

Figure 3I:
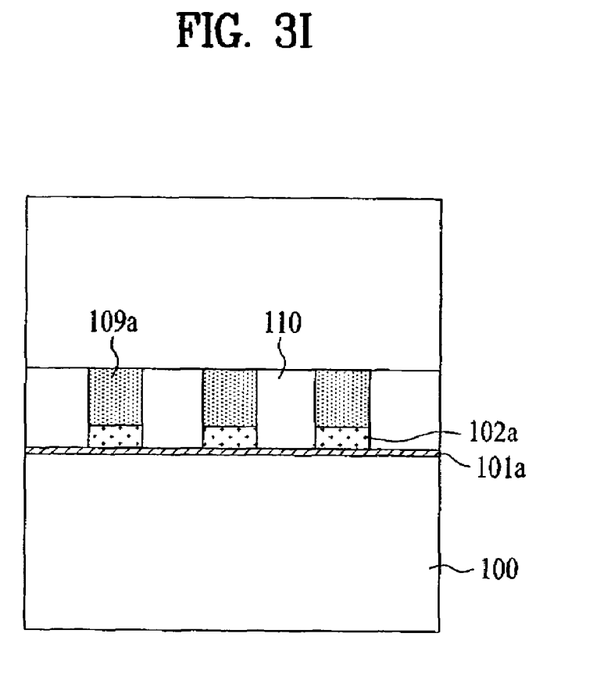
Figure 3J:
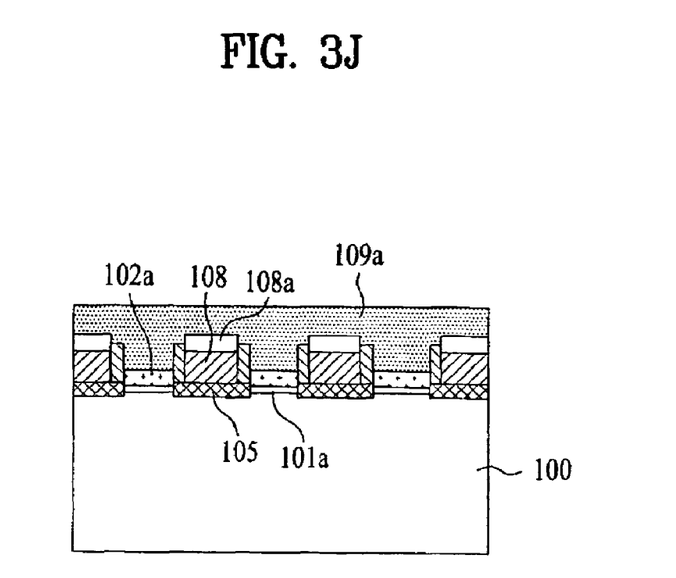

Referring to FIG. 3I and FIG. 3J, a gap between a pair of the word lines is filed up with an insulating layer 110 of oxide.

The above-fabricated mask ROM basically follows a read operation of ROM (read only memory). A voltage of about 1.0V is applied to the bit line and a power source voltage (Vcc) is applied to the word line (gate line).

Hence, the present invention is characterized in that the bit line is implemented through the shallow BN junction region 105 and the second electrode layer pattern 108 contacting with the BN junction region 105.

Accordingly, the present invention provides the following effects or advantages.

First, the bit line of the present invention includes the second electrode layer pattern having ohmic contact with the substrate. Hence, by adjusting the thickness or concentration of the second electrode layer pattern, the bit line sheet resistance can be reduced.

Second, by reducing the bit line sheet resistance, the BN (buried N doped) junction depth of the flat cell can be minimized.

Third, by reducing the depth of the BN junction region, a channel margin of a device can be secured.

Fourth, a BN junction interval can be minimized by adjusting the concentration and depth of the second electrode layer vertically connected to the BN junction, cell dimensions in word and bit line directions can be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a mask ROM, comprising the steps of:

forming a gate insulating layer on a semiconductor substrate divided into a device isolation area and an active area;

depositing a first electrode layer, a first dielectric layer and a second dielectric layer on the gate insulating layer;

forming a first electrode layer pattern, a first dielectric layer pattern and a second dielectric layer pattern, each having the same width, on a predetermined area of the gate insulating by selectively removing the first electrode layer, the first dielectric layer and the second dielectric layer;

forming an impurity region by implanting impurities into an area excluding the first electrode layer pattern;

forming a second electrode layer pattern on the impurity region;

forming an oxide layer by oxidizing a surface of the second electrode layer pattern;

removing the first and second dielectric layer patterns;

forming a third electrode layer over the semiconductor substrate including the first and second electrode layer patterns;

planarizing the third electrode layer;

forming a word line by selectively removing the first and third electrode layers; and filling a gap between the word lines with an oxide layer.

2. The method of claim 1, further comprising the step of forming a sidewall spacer on lateral sides of the first electrode layer pattern, the first dielectric layer pattern, and the second dielectric layer pattern prior to the impurity region forming step.

3. The method of claim 1, wherein the impurity region is formed after a buffer insulating layer has been deposited on the semiconductor substrate.

4. The method of claim 1, wherein the first to third electrode layers are formed of doped polysilicon.

* * * * *